(12) United States Patent
Nilchi et al.

(10) Patent No.: US 11,502,690 B1
(45) Date of Patent: Nov. 15, 2022

(54) POWER SUPPLY GENERATION FOR TRANSMITTER

(71) Applicant: Avago Technologies International Sales Pte. Limited, Singapore (SG)

(72) Inventors: Alireza Nilchi, Irvine, CA (US); Anand J. Vasani, Irvine, CA (US); Arvindh Iyer, Lake Forest, CA (US); Jun Cao, Irvine, CA (US); Afshin Momtaz, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 17/512,256

(22) Filed: Oct. 27, 2021

(51) Int. Cl.
  *H03K 19/0185* (2006.01)
  *H03K 3/037* (2006.01)
  *H03K 5/02* (2006.01)

(52) U.S. Cl.
  CPC ..... *H03K 19/018507* (2013.01); *H03K 3/037* (2013.01); *H03K 5/02* (2013.01)

(58) Field of Classification Search
  CPC ................. H03K 5/02; H03K 19/0185; H03K 19/018507
  See application file for complete search history.

(56) References Cited

U.S. PATENT DOCUMENTS 9,608,615 B2 * 3/2017 Moscaluk ............. G11C 11/417

* cited by examiner

*Primary Examiner* — Patrick O Neill
(74) *Attorney, Agent, or Firm* — Foley & Lardner LLP

(57) ABSTRACT

Disclosed herein are related to systems and methods for providing different power supply levels. In one aspect, a first circuit generates a first signal having a first amplitude according to a first supply voltage. A latch may be coupled to a resistor of a plurality of resistors coupled in series. One end of the resistor may be configured to provide to the latch a second supply voltage higher than the first supply voltage according to a third supply voltage higher than the second supply voltage, and another end of the resistor may be configured to receive the third supply voltage. The latch may modify the first signal to provide a second signal, according to the second supply voltage. An amplifier may amplify the second signal to provide a third signal having a second amplitude larger than the first amplitude, according to the third supply voltage.

20 Claims, 10 Drawing Sheets

POWER SUPPLY GENERATION FOR TRANSMITTER

FIELD OF THE DISCLOSURE

This disclosure generally relates to a system and a method of providing different power supply levels, including but not limited to, a system and a method of providing different power supply levels for an amplifier.

BACKGROUND OF THE DISCLOSURE

Recent developments in circuit design enable various circuit components to be integrated in a small form factor. In one example, over millions of circuit components can be integrated into an integrated circuit (or a chip) to perform various operations. Different portions of circuits in an integrated circuit may operate in different supply domains. For example, a digital circuit may be powered and operate according to a first power domain, whereas an analog circuit may be powered and operate according to a second power domain.

SUMMARY

Various embodiments disclosed herein are related to a system including a first circuit, a second circuit, a third circuit, and a resistor ladder. In some embodiments, the first circuit is configured to generate a first signal having a first voltage amplitude, according to a first supply voltage. In some embodiments, the second circuit is electrically coupled to the first circuit. In some embodiments, the second circuit includes a latch circuit to modify the first signal to generate a second signal, according to a second supply voltage higher than the first supply voltage. In some embodiments, the third circuit is electrically coupled to the second circuit. In some embodiments, the third circuit is configured to amplify the second signal to generate a third signal having a second voltage amplitude larger than the first voltage amplitude, according to a third supply voltage higher than the second supply voltage. In some embodiments, the resistor ladder circuit includes at least a first resistor and a second resistor electrically coupled in series. In some embodiments, one end of the first resistor is configured to receive the third supply voltage. In some embodiments, one end of the second resistor is electrically coupled to the latch circuit to provide the second supply voltage to the latch circuit, according to the third supply voltage.

Various embodiments disclosed herein are related to a system comprising circuitry to generate a first signal having a first voltage amplitude according to a first supply voltage. In some embodiments, the circuitry includes a latch electrically coupled to a resistor of a plurality of resistors electrically coupled in series. In some embodiments, one end of the resistor is configured to provide a second supply voltage to the latch according to a third supply voltage. In some embodiments, another end of the resistor is configured to receive the third supply voltage. In some embodiments, the circuitry is configured to modify, by the latch, the first signal to provide a second signal, according to the second supply voltage higher than the first supply voltage. In some embodiments, the circuitry is configured to amplify the second signal to provide a third signal having a second voltage amplitude larger than the first voltage amplitude, according to the third supply voltage higher than the second supply voltage.

In some embodiments, the circuitry is to generate the first signal swinging between the first supply voltage and a first source voltage. In some embodiments, the latch is configured to generate the second signal swinging between the second supply voltage and a second source voltage. In some embodiments, the second source voltage is higher than the first source voltage. In some embodiments, an end of another resistor of the plurality of resistors is electrically coupled to the latch to provide the second source voltage.

In some embodiments, the circuitry further includes another latch to modify the first signal to generate a fourth signal. In some embodiments, the circuitry is configured to generate the third signal according to the second signal and the fourth signal. In some embodiments, the circuitry is configured to generate the first signal swinging between the first supply voltage and a first source voltage. In some embodiments, the latch is configured to generate the second signal swinging between the second supply voltage and a second source voltage. In some embodiments, the second source voltage is higher than the first source voltage. In some embodiments, the another latch is configured to generate the fourth signal swinging between a fourth supply voltage and a third source voltage. In some embodiments, the fourth supply voltage is lower than the second source voltage. In some embodiments, the third source voltage is lower than the fourth supply voltage. In some embodiments, one end of another resistor of the plurality of resistors is electrically coupled to the another latch to provide the fourth supply voltage to the another latch, according to the third supply voltage. In some embodiments, the system further includes at least a first resistor and a second resistor electrically coupled in series. In some embodiments, one end of the first resistor is to receive the third supply voltage. In some embodiments, another end of the first resistor is electrically coupled to the another latch to provide the fourth supply voltage to the another latch, according to the third supply voltage.

In some embodiments, the circuitry includes a capacitor electrically coupled to an input of the latch. In some embodiments, the plurality of resistors are configured to detect a change in the second signal attributed by the capacitor. In some embodiments, the plurality of resistors are configured to adjust the second supply voltage to reduce a difference between i) the change in the second signal attributed by the capacitor, and ii) a third voltage amplitude of the second signal.

In some embodiments, the latch includes a first inverter, a second inverter, a first port electrically coupled to an input of the first inverter and an output of the second inverter, and a second port electrically coupled to an input of the second inverter and an output of the first inverter. In some embodiments, the circuitry includes a first circuit configured to generate the first signal, according to the first supply voltage, and a second circuit to amplify the second signal to generate the third signal, according to the third supply voltage. In some embodiments, the first port of the latch is electrically coupled to a first input of the second circuit. In some embodiments, the second port of the latch is electrically coupled to a second input of the second circuit. In some embodiments, the circuitry further includes a capacitor electrically coupled between the first circuit and the first port. In some embodiments, one end of another resistor of the plurality of resistors is electrically coupled to the another end of the resistor. In some embodiments, the system further includes another capacitor electrically coupled between the one end of the another resistor and another end of the another resistor.

In some embodiments, one or more of the plurality of resistors are variable resistors or programmable resistors.

Various embodiments disclosed herein are related to a system including a first latch, a second latch, an amplifier and a resistor ladder. In some embodiments, the first latch is configured to receive a first signal and generate a second signal swinging between a first supply voltage and a first source voltage, according to the first signal. In some embodiments, the second latch is configured to receive the first signal and generate a third signal swinging between a second supply voltage and a second source voltage, according to the first signal. In some embodiments, the amplifier is electrically coupled to the first latch and the second latch. In some embodiments, the amplifier is configured to receive the second signal and the third signal and generate a fourth signal based on a third supply voltage and a third source voltage. In some embodiments, the resistor ladder is electrically coupled to the first latch and the second latch. In some embodiments, the resistor ladder is configured to provide the first supply voltage and the first source voltage to the first latch, according to the third supply voltage. In some embodiments, the resistor ladder is configured to provide the second supply voltage and the second source voltage to the second latch, according to the third supply voltage.

In some embodiments, the second signal is a differential signal, and the third signal is another differential signal.

In some embodiments, the amplifier includes a first differential pair circuit including inputs electrically coupled to outputs of the first latch. In some embodiments, the amplifier includes a second differential pair circuit including inputs electrically coupled to outputs of the second latch. In some embodiments, outputs of the first differential pair circuit are electrically coupled to outputs of the second differential pair circuit.

In some embodiments, the resistor ladder includes a first resistor and a second resistor electrically coupled in series. In some embodiments, one end of the first resistor is configured to receive the third supply voltage. In some embodiments, another end of the first resistor is electrically coupled to the second latch to provide the second supply voltage to the second latch, according to the third supply voltage. In some embodiments, one end of the second resistor is electrically coupled to the second latch to provide the second source voltage to the second latch, according to the third supply voltage. In some embodiments, the resistor ladder further includes a third resistor and a fourth resistor electrically coupled in series with the first resistor and the second resistor. In some embodiments, one end of the third resistor is electrically coupled to the first latch to provide the first supply voltage to the first latch, according to the third supply voltage. In some embodiments, one end of the fourth resistor is electrically coupled to the first latch to provide the first source voltage to the first latch, according to the third supply voltage. In some embodiments, the third supply voltage is higher than the second supply voltage. In some embodiments, the second supply voltage is higher than the first supply voltage. In some embodiments, the second source voltage is higher than the first source voltage. In some embodiments, the first source voltage is higher than the third source voltage.

Various embodiments disclosed herein are related to a method of providing power. In some embodiments, the method includes generating, by circuitry, a first signal having a first voltage amplitude, according to a first supply voltage. In some embodiments, the method includes modifying, by a latch of the circuitry, the first signal to generate a second signal having a second voltage amplitude, according to a second supply voltage higher than the first supply voltage. In some embodiments, the method includes detecting, by a resistor ladder of the circuitry, a change in the second signal attributed by a capacitor electrically coupled to an input of the latch. In some embodiments, the method includes adjusting, by the resistor ladder of the circuitry, the second supply voltage, according to the detected change in the second signal.

In some embodiments, adjusting, by the resistor ladder, the second supply voltage, according to the detected change in the second signal includes adjusting, by the resistor ladder, the second supply voltage to reduce a difference between i) the change in the second signal attributed by the capacitor, and ii) the second voltage amplitude.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

The details of various embodiments of the methods and systems are set forth in the accompanying drawings and the description below.

DETAILED DESCRIPTION

For purposes of reading the description of the various embodiments below, the following descriptions of the sections of the specification and their respective contents can be helpful:

Section A describes a network environment and computing environment which can be useful for practicing embodiments described herein; and Section B describes embodiments of systems and methods of providing different supply voltages for an amplifier, according to one or more embodiments.

A. Computing and Network Environment

Figure 1A:
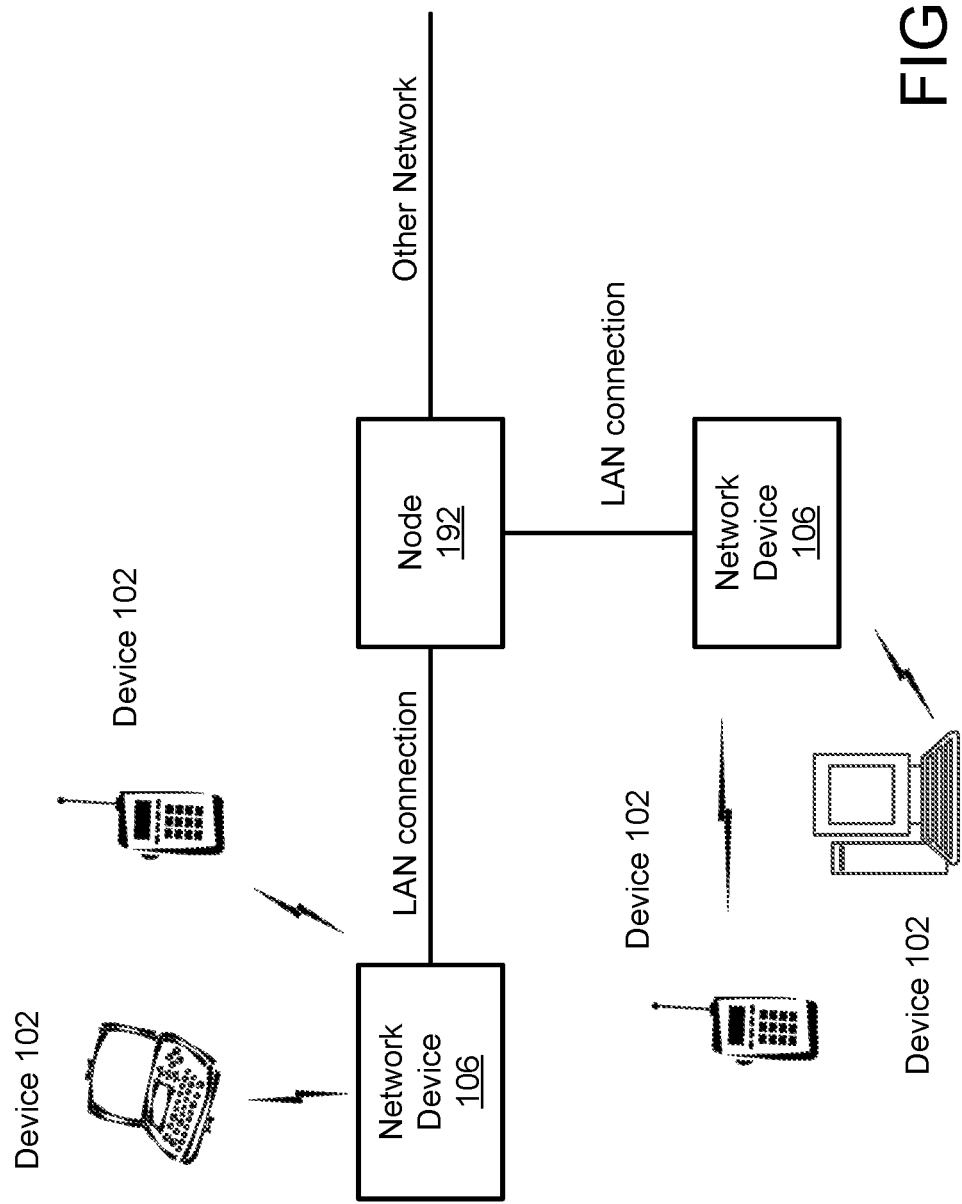
FIG. 1A is a block diagram depicting a network environment including one or more access points in communication with one or more devices or stations, according to one or more embodiments.

Prior to discussing specific embodiments of the present solution, it can be helpful to describe aspects of the operating environment as well as associated system components (e.g., hardware elements) in connection with the methods and systems described herein. Referring to FIG. 1A, an embodiment of a network environment is depicted. In brief overview, the network environment includes a wireless communication system that includes one or more access points (APs) 106, one or more wireless communication devices 102 and a network hardware component 192. The wireless communication devices 102 can for example include laptop computers 102, tablets 102, personal computers 102 and/or cellular telephone devices 102. The details of an embodiment of each wireless communication device 102 and/or AP 106 are described in greater detail with reference to FIGS. 1B and 1C. The network environment can be an ad hoc network environment, an infrastructure wireless network environment, a subnet environment, etc. in one embodiment. The APs 106 can be operably coupled to the network hardware 192 via local area network connections. The network hardware 192, which can include a router, gateway, switch, bridge, modem, system controller, appliance, etc., can provide a local area network connection for the communication system. Each of the APs 106 can have an associated antenna or an antenna array to communicate with the wireless communication devices in its area. The wireless communication devices 102 can register with a particular AP 106 to receive services from the communication system (e.g., via a SU-MIMO or MU-MIMO configuration). For direct connections (e.g., point-to-point communications), some wireless communication devices can communicate directly via an allocated channel and communications protocol. Some of the wireless communication devices 102 can be mobile or relatively static with respect to AP 106.

In some embodiments an AP 106 includes a device or module (including a combination of hardware and software) that allows wireless communication devices 102 to connect to a wired network using wireless-fidelity (WiFi), or other standards. An AP 106 can sometimes be referred to as a wireless access point (WAP). An AP 106 can be implemented (e.g., configured, designed and/or built) for operating in a wireless local area network (WLAN). An AP 106 can connect to a router (e.g., via a wired network) as a standalone device in some embodiments. In other embodiments, an AP 106 can be a component of a router. An AP 106 can provide multiple devices access to a network. An AP 106 can, for example, connect to a wired Ethernet connection and provide wireless connections using radio frequency links for other devices 102 to utilize that wired connection. An AP 106 can be implemented to support a standard for sending and receiving data using one or more radio frequencies. Those standards, and the frequencies they use can be defined by the IEEE (e.g., IEEE 802.11 standards). An AP 106 can be configured and/or used to support public Internet hotspots, and/or on a network to extend the network's Wi-Fi signal range.

In some embodiments, the access points 106 can be used for (e.g., in-home or in-building) wireless networks (e.g., IEEE 802.11, Bluetooth, ZigBee, any other type of radio frequency-based network protocol and/or variations thereof). Each of the wireless communication devices 102 can include a built-in radio and/or is coupled to a radio. Such wireless communication devices 102 and/or access points 106 can operate in accordance with the various aspects of the disclosure as presented herein to enhance performance, reduce costs and/or size, and/or enhance broadband applications. Each wireless communication device 102 can have the capacity to function as a client node seeking access to resources (e.g., data, and connection to networked nodes such as servers) via one or more access points 106.

The network connections can include any type and/or form of network and can include any of the following: a point-to-point network, a broadcast network, a telecommunications network, a data communication network, a computer network. The topology of the network can be a bus, star, or ring network topology. The network can be of any such network topology as known to those ordinarily skilled in the art capable of supporting the operations described herein. In some embodiments, different types of data can be transmitted via different protocols. In other embodiments, the same types of data can be transmitted via different protocols.

Figure 1B:
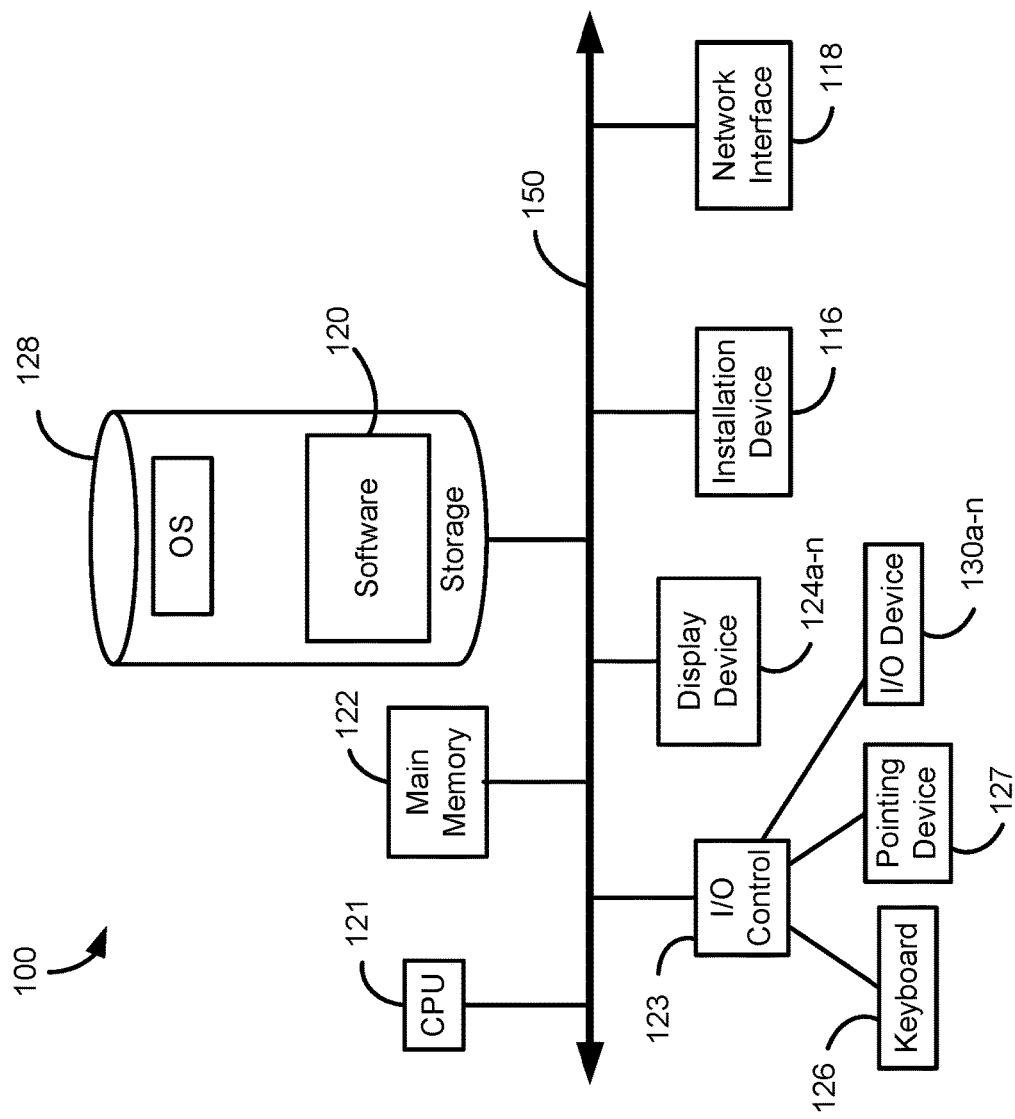
FIGS. 1B and 1C are block diagrams depicting computing devices useful in connection with the methods and systems described herein, according to one or more embodiments.
Figure 1C:
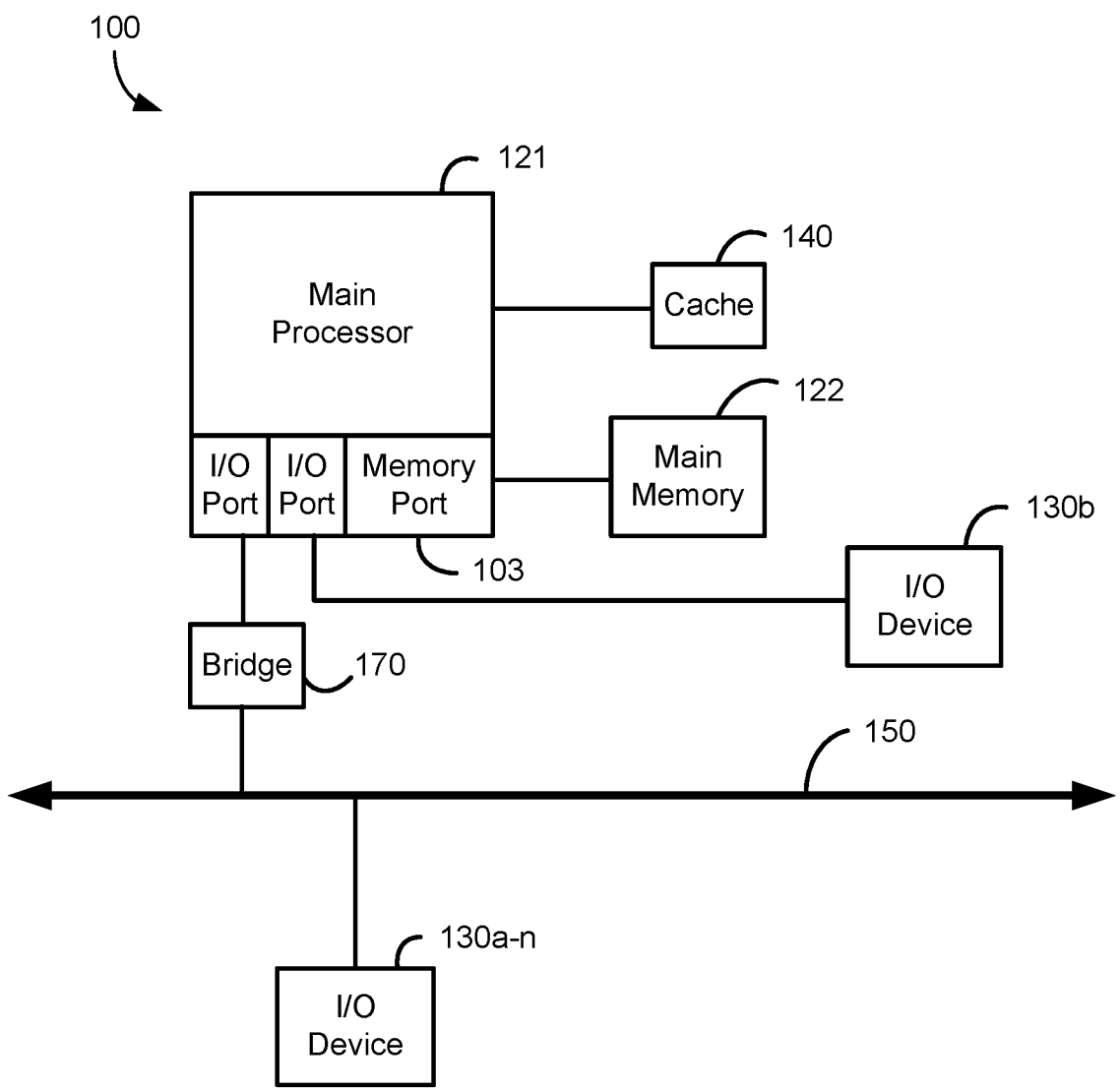

The communications device(s) 102 and access point(s) 106 can be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication devices 102 or AP 106. As shown in FIGS. 1B and 1C, each computing device 100 includes a central processing unit 121, and a main memory unit 122. As shown in FIG. 1B, a computing device 100 can include a storage device 128, an installation device 116, a network interface 118, an I/O controller 123, display devices 124a-124n, a keyboard 126 and a pointing device 127, such as a mouse. The storage device 128 can include an operating system and/or software. As shown in FIG. 1C, each computing device 100 can also include additional optional elements, such as a memory port 103, a bridge 170, one or more input/output devices 130a-130n, and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Santa Clara, Calif.; those manufactured by International Business Machines of White Plains, N.Y.; or those manufactured by Advanced Micro Devices of Sunnyvale, Calif. The computing device 100 can be based on any of these processors, or any other processor capable of operating as described herein.

Main memory unit 122 can be one or more memory chips capable of storing data and allowing any storage location to be directly accessed by the microprocessor 121, such as any type or variant of Static random access memory (SRAM), Dynamic random access memory (DRAM), Ferroelectric RAM (FRAM), NAND Flash, NOR Flash and Solid State Drives (SSD). The main memory 122 can be based on any of the above-described memory chips, or any other available memory chips capable of operating as described herein. In the embodiment shown in FIG. 1B, the processor 121 communicates with main memory 122 via a system bus 150 (described in more detail below). FIG. 1C depicts an embodiment of a computing device 100 in which the processor communicates directly with main memory 122 via a memory port 103. For example, in FIG. 1C the main memory 122 can be DRDRAM.

FIG. 1C depicts an embodiment in which the main processor 121 communicates directly with cache memory 140 via a secondary bus, sometimes referred to as a backside bus. In other embodiments, the main processor 121 communicates with cache memory 140 using the system bus 150. Cache memory 140 typically has a faster response time than main memory 122 and is provided by, for example, SRAM, BSRAM, or EDRAM. In the embodiment shown in FIG. 1C, the processor 121 communicates with various I/O devices 130 via a local system bus 150. Various buses can be used to connect the central processing unit 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 121 can use an Advanced Graphics Port (AGP) to communicate with the display 124. FIG. 1C depicts an embodiment of a computer 100 in which the main processor 121 can communicate directly with I/O device 130*b*, for example via HYPERTRANSPORT, RAPIDIO, or INFINI-BAND communications technology. FIG. 1C also depicts an embodiment in which local busses and direct communication are mixed: the processor 121 communicates with I/O device 130*a* using a local interconnect bus while communicating with I/O device 130*b* directly.

A wide variety of I/O devices 130*a*-130*n* can be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices can be controlled by an I/O controller 123 as shown in FIG. 1B. The I/O controller can control one or more I/O devices such as a keyboard 126 and a pointing device 127, e.g., a mouse or optical pen. Furthermore, an I/O device can also provide storage and/or an installation medium 116 for the computing device 100. In still other embodiments, the computing device 100 can provide USB connections (not shown) to receive handheld USB storage devices such as the USB Flash Drive line of devices manufactured by Twintech Industry, Inc. of Los Alamitos, Calif.

Referring again to FIG. 1B, the computing device 100 can support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 can further include a storage device, such as one or more hard disk drives or redundant arrays of independent disks, for storing an operating system and other related software, and for storing application software programs such as any program or software 120 for implementing (e.g., configured and/or designed for) the systems and methods described herein. Optionally, any of the installation devices 116 could also be used as the storage device. Additionally, the operating system and the software can be run from a bootable medium.

Furthermore, the computing device 100 can include a network interface 118 to interface to the network 104 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 can include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 can include or be connected to one or more display devices 124*a*-124*n*. As such, any of the I/O devices 130*a*-130*n* and/or the I/O controller 123 can include any type and/or form of suitable hardware, software, or combination of hardware and software to support, enable or provide for the connection and use of the display device(s) 124*a*-124*n* by the computing device 100. For example, the computing device 100 can include any type and/or form of video adapter, video card, driver, and/or library to interface, communicate, connect or otherwise use the display device(s) 124*a*-124*n*. In one embodiment, a video adapter can include multiple connectors to interface to the display device(s) 124*a*-124*n*. In other embodiments, the computing device 100 can include multiple video adapters, with each video adapter connected to the display device(s) 124*a*-124*n*. In some embodiments, any portion of the operating system of the computing device 100 can be configured for using multiple displays 124*a*-124*n*. In further embodiments, an I/O device 130 can be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 100 of the sort depicted in FIGS. 1B and 1C can operate under the control of an operating system, which control scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7, 8 and 10, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y.; and Linux, a freely-available operating system distributed by Caldera Corp. of Salt Lake City, Utah, or any type and/or form of a Unix operating system, among others.

The computer system 100 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. In some embodiments, the computing device 100 can have different processors, operating systems, and input devices consistent with the device. For example, in one embodiment, the computing device 100 is a smart phone, mobile device, tablet or personal digital assistant. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Aspects of the operating environments and components described above will become apparent in the context of the systems and methods disclosed herein.

B. Multi-Level Power Generation

Various embodiments disclosed herein are related to systems and methods for providing different power supply levels or different supply voltages. In one aspect, a system includes a first circuit, a second circuit, and a third circuit operating according to different supply voltages and/or source voltages. The first circuit may generate a first signal having a first voltage amplitude, according to a first supply voltage. The second circuit may include one or more latches (or latch circuits) to amplify, adjust, or modify the first signal to generate a second signal, according to a second supply voltage. The third circuit may receive the second signal and generate a third signal having a larger voltage amplitude than the first voltage amplitude, according to a third supply voltage. In one aspect, the system includes one or more resistor ladders (or resistor ladder circuits) electrically coupled to the one or more latches. The one or more resistor ladders may receive the third supply voltage and provide the second supply voltage to the one or more latches based on the third supply voltage.

Beneficially, the disclosed systems and methods can achieve various advantages. In one aspect, the resistor ladder can perform a feedback operation to improve performance or reliability of communication of the system. For example, the resistor ladder can detect a change in the second signal attributed by a capacitor electrically coupled to an input of the latch, and adjust the second supply voltage, according to the detected change in the second signal to perform the feedback operation. Accordingly, peaking of the second signal and the third signal can be optimized to allow improvement in an eye opening of the second signal and the third signal. In addition, InterSymbol Interference (ISI) can be reduced, and linearity of the third circuit can be improved.

The disclosed systems and methods can also provide additional advantages. In one aspect, the disclosed system implements one or more resistor ladders to provide different supply voltages, such that low drop out regulator (LDO) can be obviated. By implementing one or more resistor ladders instead of the LDO(s), the disclosed system can be implemented in an area efficient manner and in a power efficient manner. For example, implementing one or more resistor ladders without LDO(s) allows 80% area reduction and 20% power savings. Moreover, a simple architecture of a resistor ladder does not require a complex power-up sequencing, such that additional circuits for ensuring stable start-ups can be omitted. Moreover, a resistor ladder may generate a supply voltage and/or a source voltage through a voltage division, such that random variations in the amplitude and common-mode voltage of the second signal can be substantially reduced (e.g., compared to implementing an LDO), thereby allowing a well-controlled (stable) peaking response for the second circuit and/or the third circuit.

Figure 2:
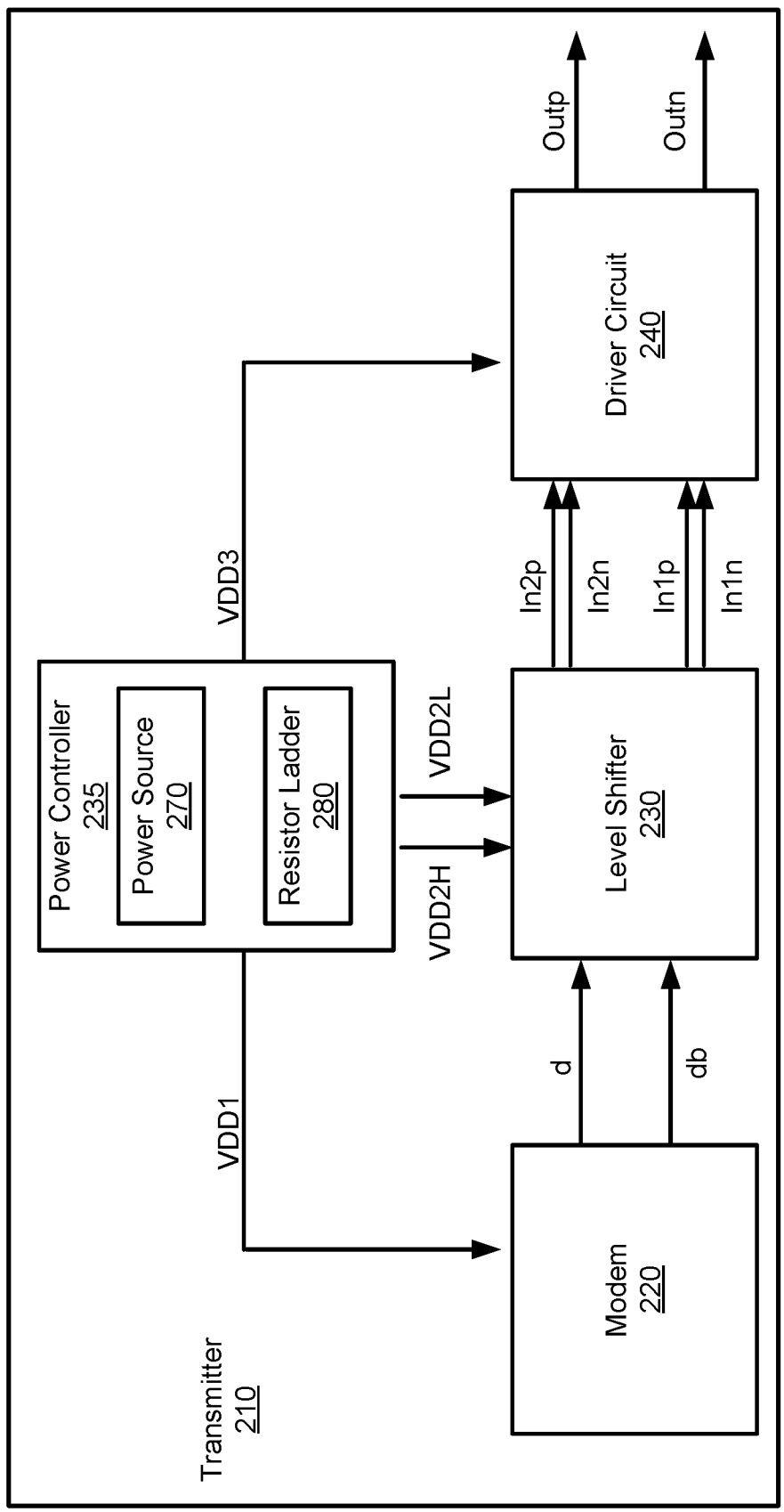
FIG. 2 is a block diagram depicting a transmitter, according to one or more embodiments.

FIG. 2 is a block diagram depicting a transmitter 210, according to one or more embodiments. In some embodiments, the transmitter 210 is part of the device 102, the node 192, or the device 106. In some embodiments, the transmitter 210 is for a wired communication (e.g., Ethernet, USB, Firewire, cable or optical communication). In some embodiments, the transmitter 210 or a portion of the transmitter 210 may be implemented for a wireless communication (e.g., cellular, near field communication, Wi-Fi, etc.). In some embodiments, the transmitter 210 operates as or is implemented as an amplifier. In some embodiments, the transmitter 210 includes a modem 220, a level shifter 230, a driver circuit 240 and a power controller 235. These components may operate together to generate and transmit signals Outp, Outn representing data for communication. In some embodiments, the transmitter 210 includes more, fewer, or different components than shown in FIG. 2. For example, the transmitter 210 may include one or more additional amplifiers that amplify signals Outp, Outn output by the driver circuit 240.

In some embodiments, the modem 220 is a circuit or a component that generates signals d, db representing data for transmission. In some embodiments, the modem 220 is implemented as a digital logic circuit. The modem 220 may generate high speed data with a data rate up to, for example, hundreds of Gbps. The modem 220 may receive a supply voltage VDD1 having a first voltage level (e.g., 0.8-1V) and generate the signals d, db having voltage amplitudes corresponding to the supply voltage VDD1. In some embodiments, the signals d, db may be differential signals. In some embodiments, a single-ended signal d may be implemented or utilized, instead of differential signals d, db.

In some embodiments, the level shifter 230 is a circuit or a component that generates signals In2p, In2n, In1p, In1n, according to the signals d, db. In some embodiments, the level shifter 230 operates as or is implemented as an amplifier. In one aspect, the level shifter 230 may include latches that adjust, modify, or amplify the signals d, db to generate the signals In2p, In2n, In1p, In1n. The signals In1p, In1n may be differential signals, and In2p, In2n may be additional differential signals. In one aspect, a common mode voltage of the differential signals In2p, In2n is higher than a common mode voltage of the differential signals In1p, In1n. The common mode voltages of the differential signals In2p, In2n, In1p, In1n may be set to allow proper operation of the driver circuit 240, as described below with respect to FIG. 3. In some embodiments, the level shifter 230 may receive a supply voltage VDD2H having a second voltage level (e.g., 2.7-3.0V) and a source voltage VSS2H (e.g. 2.45V) and generate the signals In2p, In2n having voltage amplitudes corresponding to a difference between the supply voltage VDD2H and the source voltage VSS2H. Similarly, the level shifter 230 may receive a supply voltage VDD2L having a third voltage level (e.g., 0.7-0.9V) and a source voltage VSS2L (e.g. 0.35V) generate the signals In1p, In1n having voltage amplitudes corresponding to a difference between the supply voltage VDD2L and source voltage VSS2L. In some embodiments, the supply voltage VDD3 may be equal to or lower than the supply voltage VDD1, and the supply voltage VDD2 may be lower than the supply voltage VDD1.

In some embodiments, the driver circuit 240 is a circuit or a component that generates signals Outp, Outn. In some embodiments, the driver circuit 240 operates as or is implemented as an amplifier. In one aspect, the driver circuit 240 may amplify the signals In2p, In2n, In1p, In1n to generate the signals Outp, Outn. The signals Outp, Outn may be differential signals. The driver circuit 240 may receive a supply voltage VDD3 having a fourth voltage level (e.g., 3.0-3.5V) and generate the signals Outp, Outn having voltage amplitudes based on the supply voltage VDD3 and the ground voltage GND. In one aspect, the voltage amplitudes of the signals Outp, Outn are higher than the voltage amplitudes of the signals d, db. In some embodiments, outputs of the driver circuit 240 are electrically coupled to a cable or another driver circuit. Thus, the driver circuit 240 may transmit or provide the signals Outp, Outn having higher voltage amplitudes than the voltage amplitudes of the signals d, db to another device or another driver circuit. In some embodiments, a single-ended signal Out can be implemented or utilized, instead of the differential signals Outp, Outn.

In some embodiments, the power controller 235 is a circuit or a component that generates various supply voltages VDD1, VDD2H, VDD2L, VDD3. In one aspect, the power controller 235 includes a power source 270 and one or more resistor ladders 280 electrically coupled to the power source 270 through conductive traces. The power source 270 may be any circuit or component that can provide the supply voltage VDD3. For example, the power source 270 may be a battery, or a circuit that provides a DC voltage. A resistor ladder 280 may include a plurality of resistors connected in series. The resistor ladder 280 may receive the supply voltage VDD3, and generate or provide different supply voltages VDD2H, VDD2L, according to the supply voltage VDD3. Although the power controller 235 in FIG. 2 is depicted as providing VDD1, VDD2H, VDD2L, VDD3, the power controller 235 may provide additional or different voltages than shown in FIG. 2. For example, the power controller 235 may generate or provide a ground voltage GND (or a source voltage) to the modem 220 and the driver circuit 240. For example, the power controller 235 may generate or provide different source voltages VSS2H, VSS2L to the level shifter 230. In some embodiments, the power controller 235 may lack the power source 270, and the power source 270 may be included in a different part of the device 102, 192, or 106.

Figure 3:
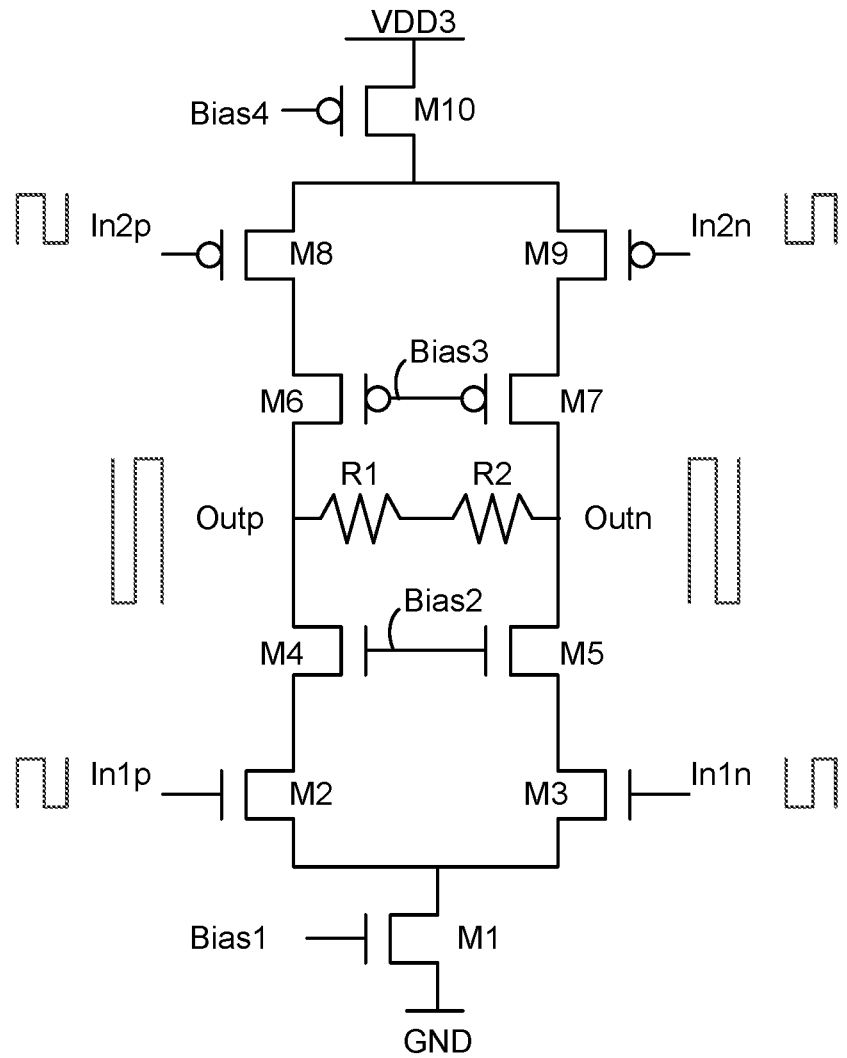
FIG. 3 is a schematic diagram of a driver circuit, according to one or more embodiments.

FIG. 3 is a schematic diagram of the driver circuit 240, according to one or more embodiments. In some embodiments, the driver circuit 240 includes transistors M1-M10 and resistors R1, R2. The transistors M1-M5 may be N-type transistors (e.g., N-type MOSFETs, N-type FinFETs, N-type BJTs, etc.), and the transistors M6-M10 may be P-type transistors (e.g., P-type MOSFETs, P-type FinFETs, P-type BJTs, etc.). These components may operate together to receive the signals In1p, In1n, In2p, In2n, and generate output signals Outp, Outn by amplifying or modifying the signals In1p, In1n, In2p, In2n. In some embodiments, the driver circuit 240 includes more, fewer, or different components, or has a different configuration than shown in FIG. 3.

In one configuration, the transistor M1 includes a source electrode electrically coupled to a metal rail to receive a ground voltage GND, a gate electrode electrically coupled to a bias circuit (not shown) to receive a bias voltage Bias1, and a drain electrode electrically coupled to source electrodes of the transistors M2, M3. The bias voltage Bias1 may be a DC voltage to allow or cause the transistor M1 to conduct current. In this configuration, the transistor M1 may operate as a current source that allows current to flow between the drain electrode and the source electrode of the transistor M1, according to the bias voltage Bias1.

In one configuration, the transistor M2 includes the source electrode electrically coupled to the drain electrode of the transistor M1, a gate electrode electrically coupled to an output of the level shifter 230 to receive the signal In1p, and a drain electrode electrically coupled to a source electrode of the transistor M4. In one configuration, the transistor M3 includes the source electrode electrically coupled to the drain electrode of the transistor M1, a gate electrode electrically coupled to an output of the level shifter 230 to receive the signal In1n, and a drain electrode electrically coupled to a source electrode of the transistor M5. In some embodiments, the transistor M4 includes a gate electrode electrically coupled to a gate electrode of the transistor M5 and a bias circuit (not shown). The bias circuit may provide a bias voltage Bias2 to the gate electrodes of the transistors M4, M5. The bias voltage Bias2 may be a DC voltage. In some embodiments, a drain electrode of the transistor M4 is electrically coupled to an output of the driver circuit 240, at which the signal Outp can be generated or provided. In some embodiments, a drain electrode of the transistor M5 is electrically coupled to an output of the driver circuit 240, at which the signal Outn can be generated or provided. In this configuration, the transistors M2, M3 may operate as a differential pair circuit that can pull down one of the voltages of the signals Outp, Outn according to the differential signals In1p, In1n. In one configuration, the transistors M4, M5 operate as cascode transistors to provide high output impedance at the outputs of the driver circuit 240. For example, in response to the signal In1p having a higher voltage than the signal In1n, more current can flow through the transistor M2 than through the transistor M3. In response to more current flowing through the transistor M2 than through the transistor M3, the voltage of the signal Outp can be lower than the voltage of the signal Outn.

In one configuration, the transistor M10 includes a source electrode electrically coupled to, for example the power controller 235, through a metal rail to receive the supply voltage VDD3, a gate electrode electrically coupled to a bias circuit (not shown) to receive a bias voltage Bias4, and a drain electrode electrically coupled to source electrodes of the transistors M8, M9. The bias voltage Bias4 may be a DC voltage to allow or cause the transistor M10 to conduct current. In this configuration, the transistor M10 may operate as a current source that allows current to flow between the source electrode and the drain electrode of the transistor M10, according to the bias voltage Bias4.

In one configuration, the transistor M8 includes the source electrode electrically coupled to the drain electrode of the transistor M10, a gate electrode electrically coupled to an output of the level shifter 230 to receive the signal In2p, and a drain electrode electrically coupled to a source electrode of the transistor M6. In one configuration, the transistor M9 includes the source electrode electrically coupled to the drain electrode of the transistor M10, a gate electrode electrically coupled to an output of the level shifter 230 to receive the signal In2n, and a drain electrode electrically coupled to a source electrode of the transistor M7. In some embodiments, the transistor M6 includes a gate electrode electrically coupled to a gate electrode of the transistor M7 and a bias circuit (not shown). The bias circuit may provide a bias voltage Bias3 to the gate electrodes of the transistors M6, M7. The bias voltage Bias3 may be a DC voltage. In some embodiments, a drain electrode of the transistor M6 is electrically coupled to the output of the driver circuit 240, at which the signal Outp can be generated or provided. In some embodiments, a drain electrode of the transistor M7 is electrically coupled to the output of the driver circuit 240, at which the signal Outn can be generated or provided. In this configuration, the transistors M8, M9 may operate as a differential pair circuit that can pull up one of the voltages of the signals Outp, Outn according to the differential signals In2p, In2n. In one configuration, the transistors M6, M7 operate as cascode transistors to provide high output impedance at the outputs of the driver circuit 240. For example, in response to the signal In2p having a higher voltage than the signal In2n, more current can flow through the transistor M9 than through the transistor M8. In response to more current flowing through the transistor M9 than through the transistor M8, the voltage of the signal Outn can be higher than the voltage of the signal Outp.

In one configuration, the resistors R1, R2 are electrically coupled between outputs of the driver circuit 240 in series. For example, one end of the resistor R1 is electrically coupled to drain electrodes of the transistors M4, M6, and another end of the resistor R1 is electrically coupled to one end of the resistor R2. For example, another end of the resistor R2 is electrically coupled to drain electrodes of the transistors M5, M7.

In one aspect, voltages of the differential signals In1p, In1n may swing between the supply voltage VDD2L and the source voltage VSS2L, whereas voltages of the differential signals In2p, In2n may swing between the supply voltage VDD2H and the source voltage VSS2H. A common mode voltage of the differential signals In2p, In2n may be higher than a common mode of the differential signals In1p, In1p. For example, a common mode voltage of the differential signals In2p, In2n may allow the differential pair M8, M9 to compare voltages of the differential signals In2p, In2n and pull up one of voltages of the signals Outp, Outn, according to the comparison. Similarly, for example, a common mode voltage of the differential signals In1p, In1n may allow the differential pair M2, M3 to compare voltages of the differential signals In1p, In1n and pull down one of voltages of the signals Outp, Outn, according to the comparison. In one aspect, the signals In1p, In2p are in-phase with each other, whereas the signals In1n, In2n are in-phase with each other. Thus, when the transistor M2 pulls down the voltage of the signal Outp, the transistor M9 may pull up the voltage of the signal Outn, according to the signals In1p, In1n, In2p, In2n. Conversely, when the transistor M3 pulls down the voltage of the signal Outn, the transistor M8 may pull up the voltage of the signal Outp, according to the signals In1p, In1n, In2p, In2n. Hence, according to the differential signals In1p, In1n and the differential signals In2p, In2n, the driver circuit 240 may generate the differential signals Outp, Outn. Because the supply voltage VDD3 is higher than the supply voltage VDD1, voltage amplitudes of the output signals Outp, Outn may be larger than voltage amplitudes of the signals d, db. In some embodiments, the driver circuit 240 may generate the output signals Outp, Outn having voltage amplitudes smaller than the voltage amplitudes of the signals d, db.

Figure 4:
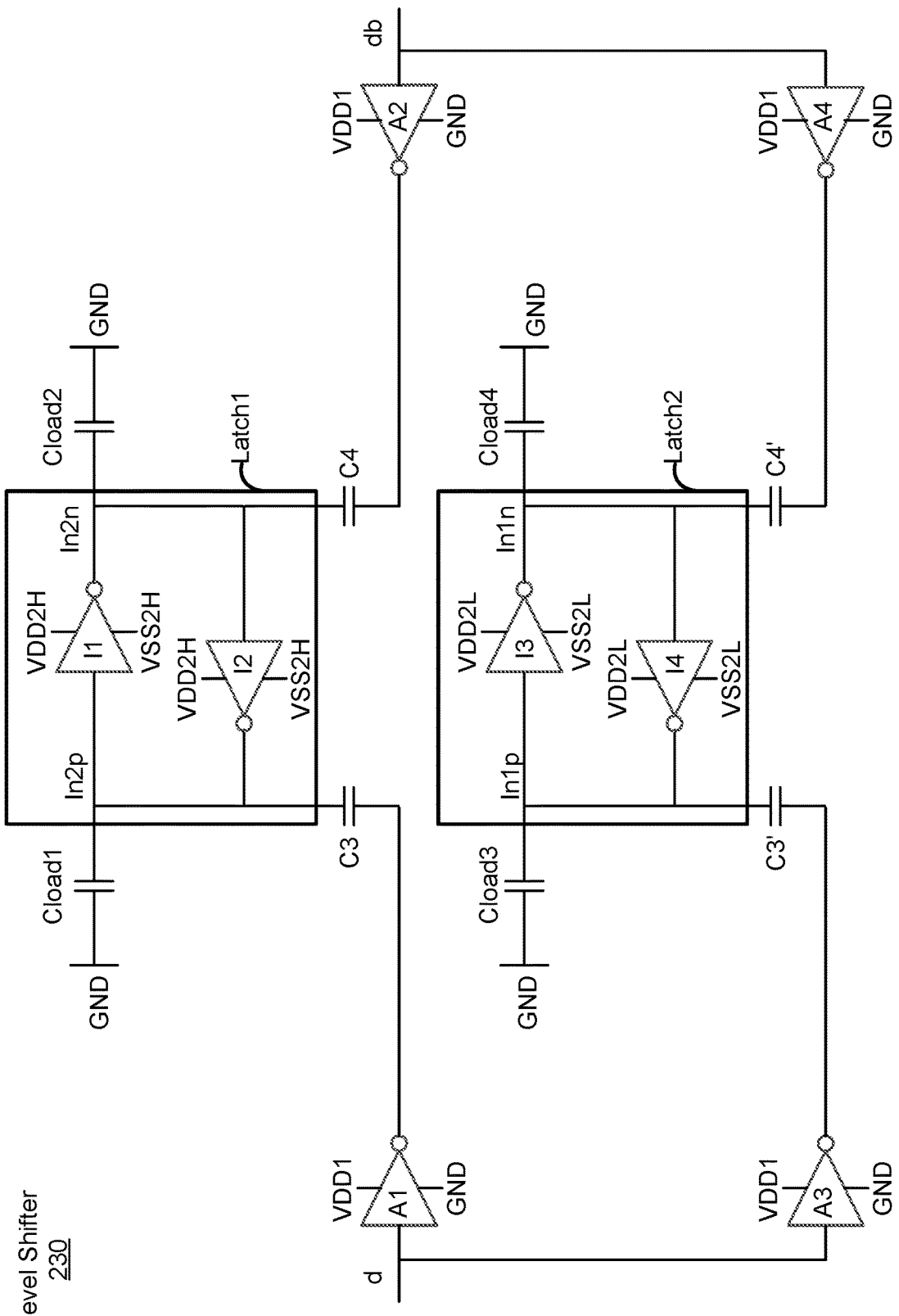
FIG. 4 is a schematic diagram of a level shifter, according to one or more embodiments.

FIG. 4 is a schematic diagram of the level shifter 230, according to one or more embodiments. In some embodiments, the level shifter 230 includes a latch circuit Latch1, a latch circuit Latch2, capacitors C3, C3', C4, C4', Cload1-Cload4, and amplifiers A1-A4. These components may operate together to receive the signals d, db from the modem 220, and amplify or modify the signals d, db to generate signals In1p, In1n, In2p, In2n. The signals In1p, In1n, In2p, In2n may be differential signals as described above with respect to FIG. 3. In some embodiments, the level shifter 230 includes more, fewer, or different components than shown in FIG. 4. For example, the capacitors Cload1-Cload4 may not be discrete capacitors implemented but may model input capacitances at the gate electrodes of the transistors M8, M9, M2, M3, respectively. For example, the amplifiers A1-A4 may be omitted, or implemented as part of the modem 220.

In some embodiments, the amplifiers A1-A4 are circuits or components that amplify the signals d, db. In one aspect, the amplifiers A1-A4 are embodied as inverters. In one configuration, the amplifier A1 includes an input electrically coupled to an input of the amplifier A3. In one configuration, the amplifier A2 includes an input electrically coupled to an input of the amplifier A4. In one configuration, a capacitor C3 is electrically coupled between the amplifier A1 and a first port of the latch Latch1, at which the signal In2p is generated. In one configuration, a capacitor C4 is electrically coupled between the amplifier A2 and a second port of the latch Latch1, at which the signal In2n is generated. In one configuration, a capacitor C3' is electrically coupled between the amplifier A3 and a first port of the latch Latch2, at which the signal In1p is generated. In one configuration, a capacitor C4' is electrically coupled between the amplifier A4 and a second port of the latch Latch2, at which the signal In1n is generated. In one aspect, the amplifiers A1-A4 are powered by the first supply voltage VDD1 and the ground voltage GND. Hence, the amplifiers A1-A4 may generate signals swinging between the first supply voltage VDD1 and the ground voltage GND, according to the signals d, db. The signals output by the amplifiers A1, A2 may be provided to the latch Latch1 through the capacitors C3, C4, respectively. Similarly, the signals output by the amplifiers A3, A4 may be provided to the latch Latch2 through the capacitors C3', C4', respectively.

In some embodiments, the latch Latch1 includes cross-coupled inverters I1, I2. In one configuration, the latch Latch1 includes a first port, at which the signal In2p is generated and a second port, at which the signal In2n is generated. In one approach, the latch Latch1 may sense a difference in voltages of signals received through the capacitors C3, C4 from the amplifiers A1, A2, and amplify or increase the difference to generate the signals In2p, In2n. The inverters I1, I2 may operate according to the supply voltage VDD2H and the source voltage VSS2H, such that the signals In2p, In2n may have voltage amplitudes between the supply voltage VDD2H and the source voltage VSS2H.

In some embodiments, the latch Latch2 includes cross-coupled inverters I3, I4. In one configuration, the latch Latch2 includes a first port, at which the signal In1p is generated and a second port, at which the signal In1n is generated. In one approach, the latch Latch2 may sense a difference in voltages of signals received through the capacitors C3', C4' from the amplifiers A3, A4, and amplify or increase the difference to generate the signals In1p, In1n. The inverters I3, I4 may operate according to the supply voltage VDD2L and the source voltage VSS2L, such that the signals In1p, In1n may have a voltage amplitude between the supply voltage VDD2L and the source voltage VSS2L. In one aspect, the supply voltage VDD2H is higher than the supply voltage VDD2L and the source voltage VSS2H is higher than the source voltage VSS2L, such that the signals In2p, In2n may have a higher common mode voltage than a common mode voltage of the signals In1p, In1n.

Figure 5:
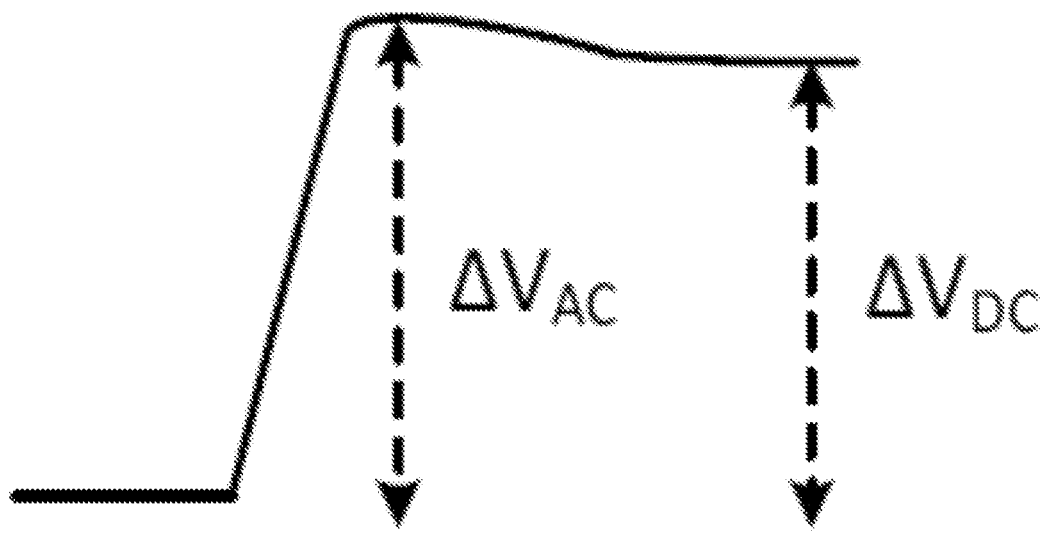
FIG. 5 is a plot showing a varying voltage of a signal the level shifter, according to one or more embodiments.

FIG. 5 is a plot 500 showing a varying voltage of an output signal (e.g., In2p, In2n, In1p, In1n) of the level shifter 230, according to one or more embodiments. In one aspect, the change in the voltage at the output of the level shifter 230 includes an AC component $\Delta V_{AC}$ and a DC component $\Delta V_{DC}$. The AC component $\Delta V_{AC}$ may be attributed by a signal injected through a capacitor (e.g., C3, C3', C4, C4').

For example, the AC component $\Delta V_{AC}$ may be attributed by a signal injected through a capacitor can be represented as below:

$$\Delta V_{AC} = \frac{C_{AC}}{C_{AC} + C_{Load}} V_{in}$$

where yin is an output of one of the amplifiers A1-A4, $C_{AC}$ is a capacitance of one of the capacitors C3, C3', C4, C4'. The DC component $\Delta V_{DC}$ may be a target voltage amplitude of the signal at the output of the level shifter 230. The DC component $\Delta V_{DC}$ may be set or correspond to a difference between the supply voltage VDD2 (e.g., VDD2H, VDD2L) and the source voltage VSS2 (e.g., VSS2H, VSS2L). In one aspect, a deviation from the target difference between the AC component $\Delta V_{AC}$ and the DC component $\Delta V_{DC}$ may reduce an eye opening of the output signals Outp, Outn, and cause ISI to degrade communication quality. In one aspect, the power controller 235 may perform feedback operation such that the DC component $\Delta V_{DC}$ may track the AC component $\Delta V_{AC}$ with a simple architecture, as described below with respect to FIGS. 6A, 6B, 7. In one aspect, to achieve certain transmitter bandwidth, the peaking in the outputs of the level shifter 230 may be adjusted or optimized. The DC component tracking the AC component can help stabilize the peaking response over process, voltage and temperature variations, and help reduce part-to-part random variations of peaking response, thereby allowing an improved eye opening and reduced ISI at the output of the transmitter 210.

Figure 6A:
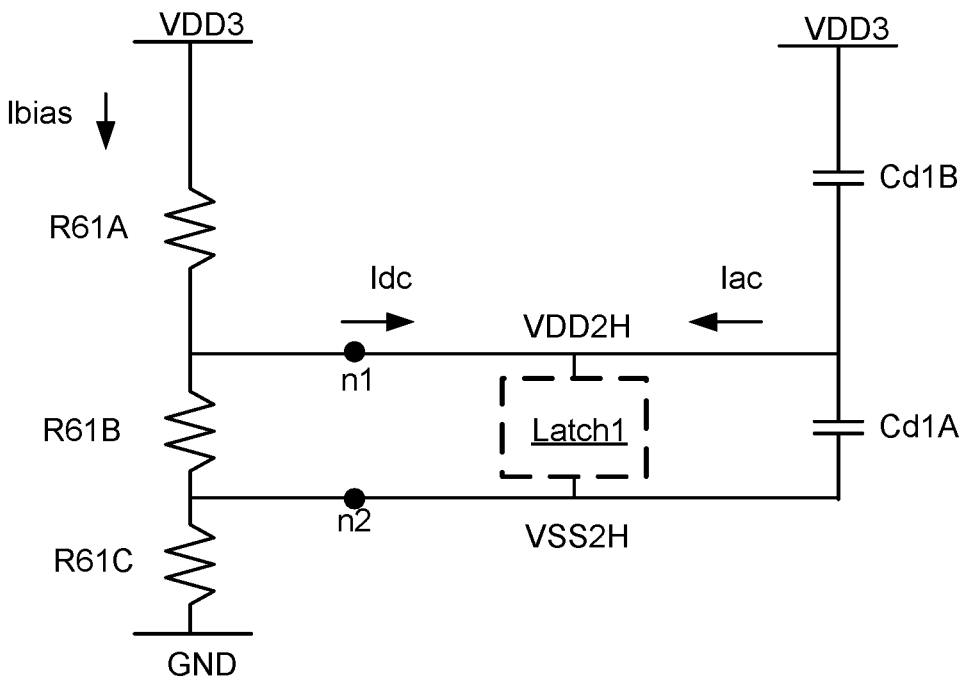
FIG. 6A is a schematic diagram of a resistor ladder providing power to a latch, according to one or more embodiments.
Figure 6A:
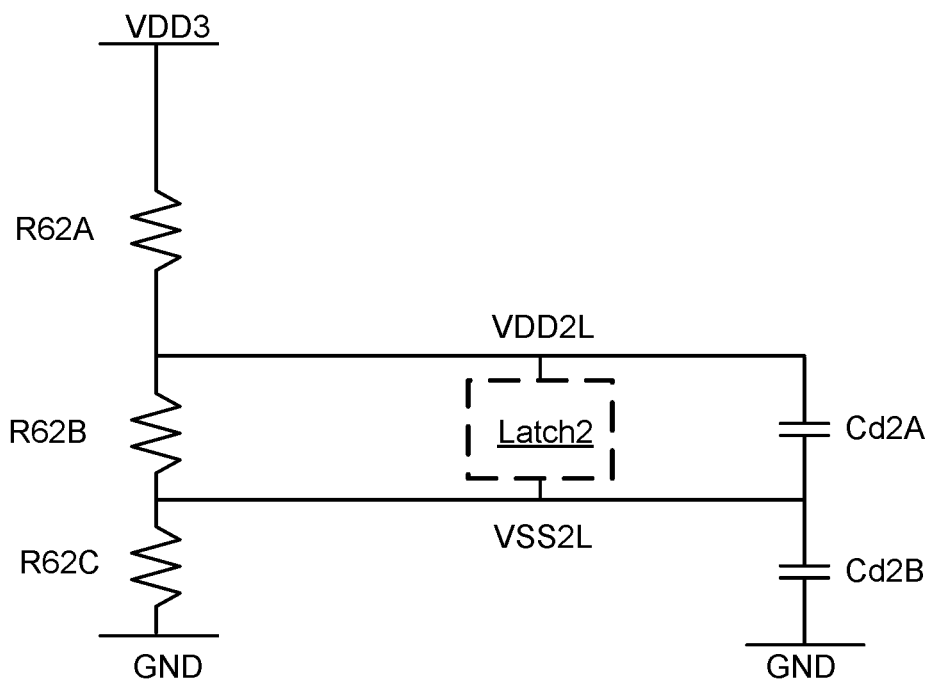

FIG. 6A is a schematic diagram of a portion 600A of the power controller 235 including resistor ladders 280 to provide power supplies to the latches Latch1, Latch2, according to one or more embodiments. In some embodiments, the portion 600A of the power controller 235 includes a first resistor ladder 280 including resistors R61A, R61B, R61C electrically coupled in series, a second resistor ladder 280 including resistors R62A, R62B, R62C electrically coupled in series, and capacitors Cd1A, Cd1B, Cd2A, Cd2B. These components may operate together to provide different voltages (e.g., supply voltages VDD2H, VDD2L and source voltages VSS2H, VSS2L) to the latches Latch1, Latch2. In some embodiments, the portion 600A of the power controller 235 includes more, fewer, or different components than shown in FIG. 6A.

In some embodiments, the first resistor ladder 280 includes the resistors R61A, R61B, R61C electrically coupled in series between a metal rail to receive the third supply voltage VDD3 and a metal rail to receive the ground voltage GND. In one configuration, one end of the resistor R61A is electrically coupled to the metal rail to receive the supply voltage VDD3, and another end of the resistor R61A is electrically coupled to a node n1. In one configuration, one end of the resistor R61B is electrically coupled to the node n1 and another end of the resistor R61B is electrically coupled to the node n2. In one configuration, one end of the resistor R61C is electrically coupled to the node n2, and another end of the resistor R61C is electrically coupled to a metal rail to receive the ground voltage GND. In one configuration, the capacitor Cd1A is electrically coupled between the node n1 and the node n2. In one configuration, the capacitor Cd1B is electrically coupled between the node n1 and the metal rail to receive the supply voltage VDD3. The capacitors Cd1A, Cd1B may be embodied as thin oxide MOS capacitors or other type of capacitors. In one aspect, the thin oxide capacitors can help achieve area efficiency. In one configuration, the latch Latch1 is electrically coupled in parallel with the capacitor Cd1A between the node n1 and the node n2. In this configuration, the first resistor ladder 280 may generate the supply voltage VDD2H at the node n1 and the source voltage VSS2H at the node n2, according to voltage division. For example, the supply voltage VDD2H may be lower than the supply voltage VDD3. For example, the source voltage VSS2H may be higher than the ground voltage GND. The capacitors Cd1A, Cd1B may reduce fluctuations of the voltages VDD2H, VSS2H. In some embodiments, one or more of the resistors R61A, R61B, R61C may be variable resistors or programmable resistors to allow the voltages at the nodes n1, n2 to be set or adjusted at target voltage levels.

In one aspect, the second resistor ladder 280 including the resistors R62A, R62B, R62C, and the capacitors Cd2A, Cd2B are configured and operate in a similar manner as the first resistor ladder 280 including the resistors R61A, R61B, R61C, and the capacitors Cd1A, Cd1B, except the second resistor ladder 280 including the resistors R62A, R62B, R62C provide the supply voltage VDD2L and the source voltage VSS2L to the latch Latch2, and the capacitor Cd2B is coupled between i) a node, at which the source voltage VSS2L is provided and ii) the metal rail to receive the ground voltage GND. Thus, detailed description of duplicated portion thereof is omitted herein for the sake of brevity. In one aspect, the resistors R62A, R62B, R62C may have different resistances than the resistors R61A, R61B, R61C, such that the supply voltage VDD2L is lower than the supply voltage VDD2H and the source voltage VSS2L is between the ground voltage GND and the source voltage VSS2H. In some embodiments, the supply voltage VDD2L is lower than the source voltage VSS2H.

In some embodiments, the resistor ladder 280 can perform feedback operation to adjust or control the supply voltage VDD2 (e.g., VDD2H, VDD2L) and/or the source voltage VSS2 (e.g., VSS2H, VSS2L). In one aspect, the current Idc through the node n1 is proportional to a difference between the AC component $\Delta V_{AC}$ and the DC component $\Delta V_{DC}$, because the amplifiers A1-A4 may cause or contribute to the AC component $\Delta V_{AC}$, based on the supply voltage VDD1 and the ground voltage GND and the latch (e.g., Latch1, Latch2) may cause or contribute to the remaining change $\Delta V_{DC}$–$\Delta V_{AC}$, based on the supply voltage VDD2 and the source voltage VSS2. Meanwhile, the DC component $\Delta V_{DC}$ can be expressed as below:

$$\Delta V_{DC} = R_{SW}(\text{Ibias}-Idc)$$

where $R_{SW}$ is a resistance of a resistor (e.g., R61B or R62B) for providing the supply voltage VDD2 and the source voltage VSS2, Ibias is the current through a resistor (e.g., R61A or R62A) electrically coupled to the metal rail for receiving the supply voltage VDD3, and Idc is the current provided to the latch (e.g., Latch1, Latch2) by the resistor ladder 280. In one aspect, an increase in the AC component $\Delta V_{AC}$ may cause a decrease in the current Idc drawn by the latch. Moreover, the decrease in the current Idc may cause the DC component $\Delta V_{DC}$ to increase. Accordingly, the resistor ladder 280 may adjust the supply voltage VDD2 and/or the source voltage VSS2, in a manner that the DC component $\Delta V_{DC}$ may track or follow the AC component $\Delta V_{AC}$. In addition, the resistor ladder 280 may generate a supply voltage through a voltage division, such that random variations of the DC component $\Delta V_{DC}$ can be substantially reduced, for example, compared to implementing an LDO. By having the DC component $\Delta V_{DC}$ track the AC component $\Delta V_{AC}$, and reducing the random variation of the DC component $\Delta V_{DC}$, an eye opening of the output signals Outp, Outn can be improved and stabilized across process, voltage, and temperature as well as from part to part, such that communication quality can be enhanced.

Figure 6B:
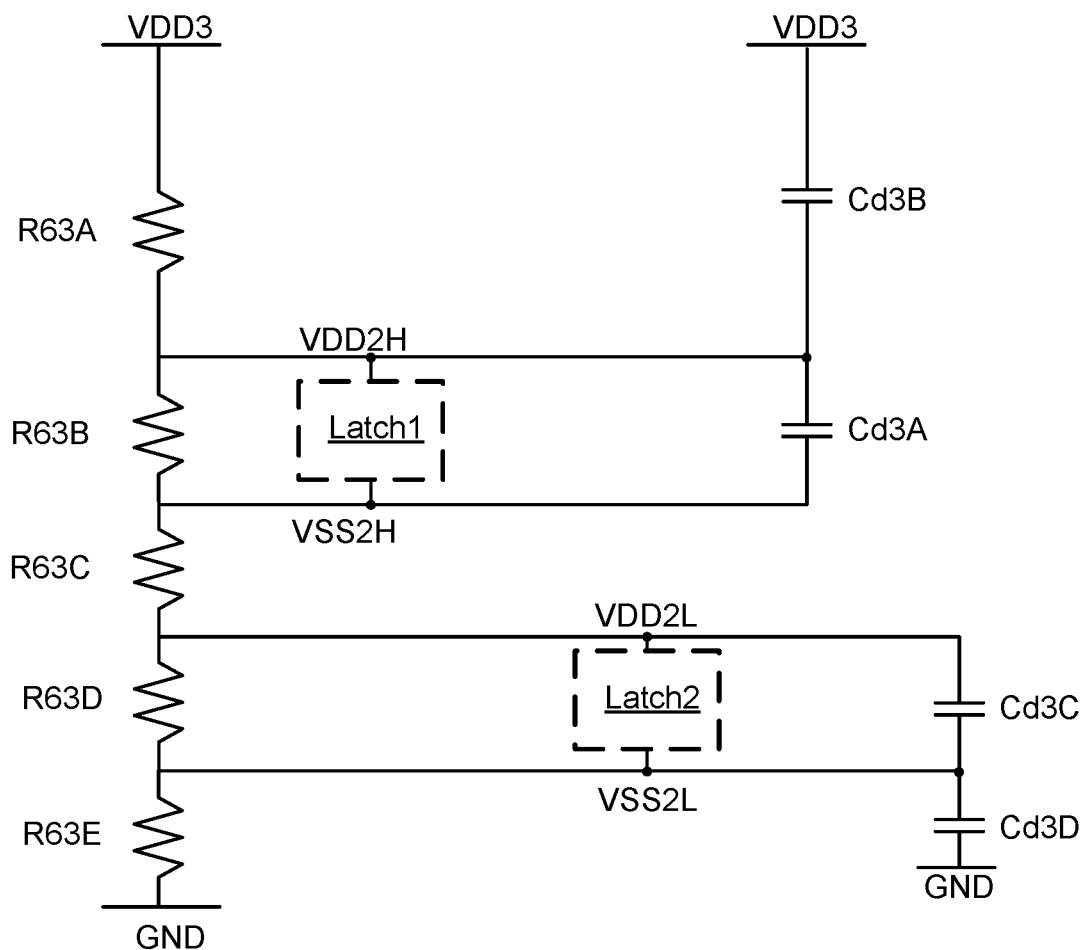
FIG. 6B is a schematic diagram of a resistor ladder providing power to a latch, according to one or more embodiments.

FIG. 6B is a schematic diagram of a portion 600B of the power controller 235 including a resistor ladder 280 to provide supply voltages to the latches Latch1, Latch2, according to one or more embodiments. In some embodiments, the portion 600B of the power controller 235 includes a resistor ladder 280 including resistors R63A, R63B, R63C, R63D, R63E electrically coupled in series, and capacitors Cd3A, Cd3B, Cd3C, Cd3D. These components may operate together to provide different voltages (e.g., supply voltages VDD2H, VDD2L and source voltages VSS2H, VSS2L) to the latches Latch1, Latch2. In some embodiments, the portion 600B of the power controller 235 includes more, fewer, or different components than shown in FIG. 6B.

In some embodiments, the resistor ladder 280 includes the resistors R63A, R63B, R63C, R63D, R63E electrically coupled in series between a metal rail to receive the third supply voltage VDD3 and a metal rail to receive the ground voltage GND. In one configuration, one end of the resistor R63A is electrically coupled to the metal rail to receive the supply voltage VDD3, and another end of the resistor R63A is electrically coupled to one end of the resistor R63B. In one configuration, another end of the resistor R63B is electrically coupled to one end of the resistor R63C, and another end of the resistor R63C is electrically coupled to one end of the resistor R63D. In one configuration, another end of the resistor R63D is electrically coupled to one end of the resistor R63E, and another end of the resistor R63E is electrically coupled to a metal rail to receive the ground voltage GND. In one configuration, the capacitor Cd3A is electrically coupled between the one end of the resistor R63B and the another end of the resistor R63B, and the capacitor Cd3B is electrically coupled in parallel with the resistor R63A. In one configuration, the capacitor Cd3C is electrically coupled between the one end of the resistor R63D and the another end of the resistor R63D, and the capacitor Cd3D is electrically coupled in parallel with the resistor R63E. The latch Latch1 may be electrically coupled in parallel with the capacitor Cd3A, and the latch Latch2 may be electrically coupled in parallel with the capacitor Cd3C. The capacitors Cd3A, Cd3B may be embodied as thin oxide MOS capacitors or other type of capacitors. In one aspect, the thin oxide capacitors can help achieve area efficiency.

In this configuration, the resistor ladder 280 including the resistors R63A, R63B, R63C, R63D, R63E may generate the supply voltages VDD2H, VDD2L, and the source voltages VSS2H, VSS2L, according to the supply voltage VDD3 through the voltage division. For example, the supply voltage VDD2H may be lower than the supply voltage VDD3, and the source voltage VSS2H may be lower than the supply voltage VDD2H. For example, the supply voltage VDD2L may be lower than the source voltage VSS2H, and the source voltage VSS2L may be lower than the supply voltage VDD2L. The capacitors Cd3A, Cd3B, Cd3C, Cd3D may reduce fluctuations of the voltages VDD2H, VSS2H, VDD2L, VSS2L. In some embodiments, one or more of the resistors R63A, R63B, R63C, R63D, R63E may be variable resistors or programmable resistors to allow the voltages at the nodes n1, n2 to be set or adjusted at target voltage levels. In one aspect, the single resistor ladder 280 including the resistors R63A, R63B, R63C, R63D, R63E as shown in FIG. 6B may consume less power than a combined power consumption of i) the first resistor ladder 280 including the resistors R61A, R61B, R61C and ii) the second resistor ladder 280 including the resistors R62A, R62B, R62C as shown in FIG. 6A, such that power consumption can be reduced.

Figure 7:
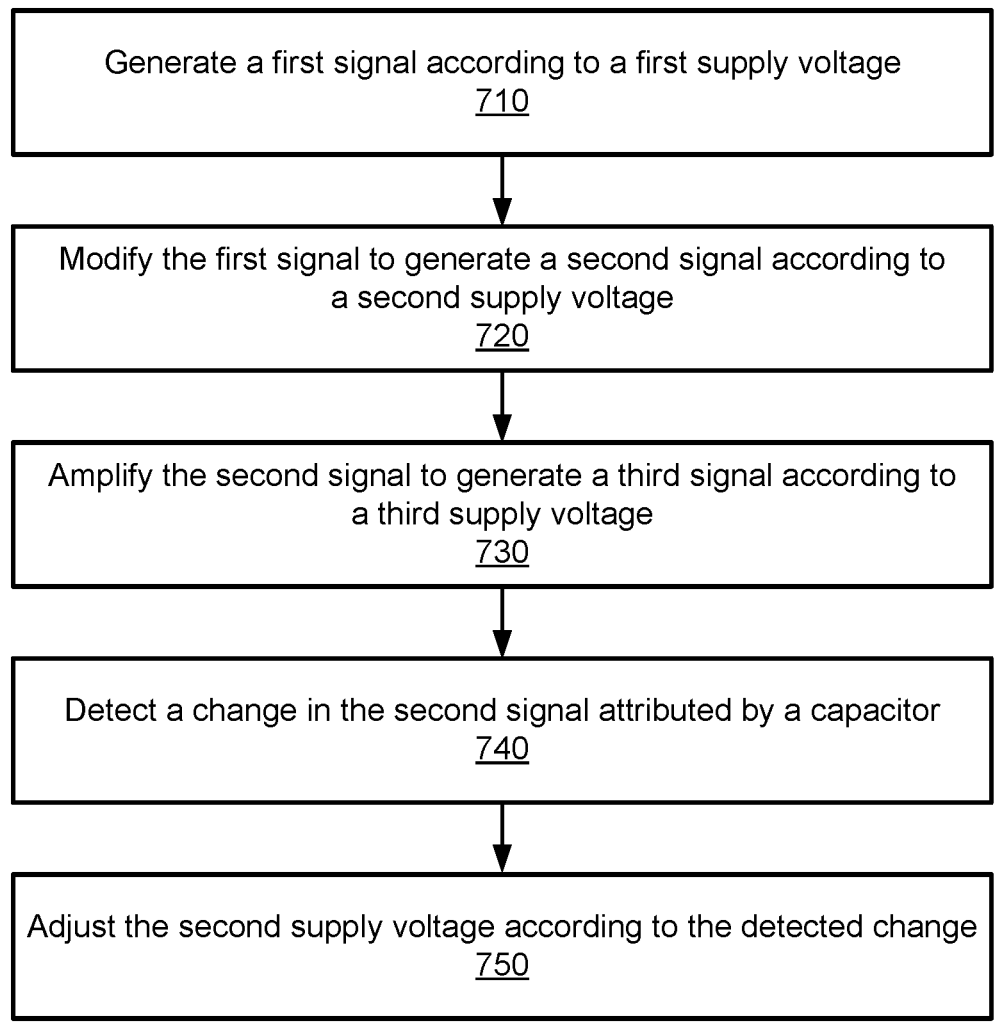
FIG. 7 is a flow chart showing a process of providing power to an amplifier, according to one or more embodiments.

FIG. 7 is a flow chart depicting a process 700 of providing power to an amplifier, according to one or more embodiments. In some embodiments, the process 700 is performed by the transmitter 210. In other embodiments, the process 700 is performed by other entities. In some embodiments, the process 700 includes more, fewer, or different steps than shown in FIG. 7.

In one approach, the transmitter 210 generates 710 a first signal according to a first supply voltage (e.g., VDD1). For example, the transmitter 210 includes the modem 220 that generates or provides a first signal representing data for communication. In some embodiments, the first signal is embodied as or is one of differential signals d, db. The modem 220 may generate high speed data with a data rate up to, for example, hundreds of Gbps. The modem 220 may receive a supply voltage VDD1 having a first voltage level (e.g., 0.8-1V) and generate the first signal having a voltage amplitude corresponding to the supply voltage VDD1.

In one approach, the transmitter 210 modifies 720 the first signal to generate a second signal according to a second supply voltage (e.g., VDD2H or VDD2L). In some embodiments, the second signal is embodied as or is one of differential signals In2p, In2n, In1p, In1n. In one example, the transmitter 210 includes the level shifter 230. The level shifter 230 may include one or more latches that generate the second signal (e.g., signals In2p, In2n, In1p, In1n). The level shifter 230 may generate the second signal having a different common mode voltage and/or amplitude than a common mode voltage and/or amplitude of the first signal. In one aspect, the second supply voltage is higher than the first supply voltage. The transmitter 210 may generate or provide the second signal having a different voltage amplitude and/or common mode voltage than the first signal for driving the driver circuit 240.

In one approach, the transmitter 210 amplifies 730 the second signal to generate a third signal according to a third supply voltage (e.g., VDD3). In some embodiments, the third signal is embodied as or is one of differential signals Outp, Outn. For example, the transmitter 210 includes the driver circuit 240 that generates or provides the third signal. In one aspect, the third supply voltage (e.g., VDD3) is higher than the second supply voltage (e.g., VDD2). In one aspect, the level shifter 230 amplifies or modifies the first signal by adjusting a voltage amplitude and/or common mode voltage of the first signal to allow the driver circuit 240 to generate the third signal having a larger voltage amplitude than the first signal.

In one approach, the transmitter 210 detects 740 a change in the second signal attributed by a capacitor electrically coupled to an input of the latch. The capacitor (e.g., C3, C3', C4, C4') may be electrically coupled between the modem and the latch (e.g., Latch1, Latch2) of the level shifter 230. In one aspect, the first signal applied to the latch through the capacitor may cause peaking or overshoot, corresponding to the AC component $\Delta V_{AC}$, as discussed above with respect to FIG. 5.

In one approach, the transmitter 210 adjusts 750 the second supply voltage according to the detected change. In one aspect, the resistor ladder 280 may detect the AC component $\Delta V_{AC}$ attributed by the capacitor and adjust the second supply voltage to reduce a difference between i) the change in the second signal attributed by the capacitor (e.g., the AC component $\Delta V_{AC}$), and ii) a voltage amplitude of the second signal (or the DC component $\Delta V_{DC}$). For example, an increase in the AC component $\Delta V_{AC}$ may cause a decrease in the current Idc provided to the latch (e.g., Latch1, Latch2) by the resistor ladder 280. The decrease in the current Idc may cause the DC component $\Delta V_{DC}$ to increase. Hence, the DC component $\Delta V_{DC}$ may track or follow the AC component $\Delta V_{AC}$. By having the DC component $\Delta V_{DC}$ track the AC component $\Delta V_{AC}$, a stable peaking response and improved eye opening and linearity of the output signals Outp, Outn can be achieved to enhance communication quality.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

It should be noted that certain passages of this disclosure can reference terms such as "first" and "second" in connection with circuit, signals, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above-described embodiments, methods, and examples, but by all embodiments and methods within the scope and spirit of the disclosure.

We claim:

1. A system comprising:
circuitry to generate a first signal having a first voltage amplitude according to a first supply voltage, and comprising:
a latch electrically coupled to a resistor of a plurality of resistors, the plurality of resistors coupled in series, one end of the resistor to provide a second supply voltage to the latch according to a third supply voltage, another end of the resistor to receive the third supply voltage,
wherein the circuitry is to:
modify, by the latch, the first signal to provide a second signal, according to the second supply voltage higher than the first supply voltage, and
amplify the second signal to provide a third signal having a second voltage amplitude larger than the first voltage amplitude, according to the third supply voltage higher than the second supply voltage.

2. The system of claim 1,
wherein the circuitry is to generate the first signal swinging between the first supply voltage and a first source voltage, and
wherein the latch is to generate the second signal swinging between the second supply voltage and a second source voltage, the second source voltage higher than the first source voltage.

3. The system of claim 2, wherein an end of another resistor of the plurality of resistors is electrically coupled to the latch to provide the second source voltage.

4. The system of claim 1, wherein the circuitry further includes:
another latch to modify the first signal to generate a fourth signal,
wherein the circuitry is to generate the third signal according to the second signal and the fourth signal.

5. The system of claim 4,
wherein the circuitry is to generate the first signal swinging between the first supply voltage and a first source voltage,
wherein the latch is to generate the second signal swinging between the second supply voltage and a second source voltage, the second source voltage higher than the first source voltage, and
wherein the another latch is to generate the fourth signal swinging between a fourth supply voltage and a third source voltage, the fourth supply voltage lower than the second source voltage, the third source voltage lower than the fourth supply voltage.

6. The system of claim 5, wherein one end of another resistor of the plurality of resistors is electrically coupled to the another latch to provide the fourth supply voltage to the another latch, according to the third supply voltage.

7. The system of claim 5, further comprising:
at least a first resistor and a second resistor electrically coupled in series,
wherein one end of the first resistor is to receive the third supply voltage, and
wherein another end of the first resistor is electrically coupled to the another latch to provide the fourth supply voltage to the another latch, according to the third supply voltage.

8. The system of claim 1, wherein the circuitry includes:
a capacitor electrically coupled to an input of the latch,
wherein the plurality of resistors are to:
detect a change in the second signal attributed by the capacitor, and adjust the second supply voltage to reduce a difference between i) the change in the second signal attributed by the capacitor, and ii) a third voltage amplitude of the second signal.

9. The system of claim 1, wherein the latch includes:
a first inverter,
a second inverter,
a first port electrically coupled to an input of the first inverter and an output of the second inverter, and
a second port electrically coupled to an input of the second inverter and an output of the first inverter.

10. The system of claim 9, wherein the circuitry includes:
a first circuit to generate the first signal, according to the first supply voltage, and
a second circuit to amplify the second signal to generate the third signal, according to the third supply voltage,
wherein the first port of the latch is electrically coupled to a first input of the second circuit,
wherein the second port of the latch is electrically coupled to a second input of the second circuit, and
wherein the circuitry further includes a capacitor electrically coupled between the first circuit and the first port.

11. The system of claim 10, wherein one end of another resistor of the plurality of resistors is coupled to the another end of the resistor, the system further comprising:
another capacitor electrically coupled between the one end of the another resistor and another end of the another resistor.

12. The system of claim 1, wherein one or more of the plurality of resistors are variable resistors or programmable resistors.

13. A system comprising:
a first latch to receive a first signal and generate a second signal swinging between a first supply voltage and a first source voltage according to the first signal;
a second latch to receive the first signal and generate a third signal swinging between a second supply voltage and a second source voltage according to the first signal;
an amplifier electrically coupled to the first latch and the second latch, the amplifier to receive the second signal and the third signal and generate a fourth signal based on a third supply voltage and a third source voltage; and
a resistor ladder electrically coupled to the first latch and the second latch, the resistor ladder to:
provide the first supply voltage and the first source voltage to the first latch, according to the third supply voltage, and
provide the second supply voltage and the second source voltage to the second latch, according to the third supply voltage.

14. The system of claim 13, wherein the second signal is a differential signal, wherein the third signal is another differential signal.

15. The system of claim 13, wherein the amplifier includes:
a first differential pair circuit including inputs electrically coupled to outputs of the first latch, and
a second differential pair circuit including inputs electrically coupled to outputs of the second latch, outputs of the first differential pair circuit electrically coupled to outputs of the second differential pair circuit.

16. The system of claim 13,
wherein the resistor ladder includes a first resistor and a second resistor electrically coupled in series,
wherein one end of the first resistor is to receive the third supply voltage,
wherein another end of the first resistor is electrically coupled to the second latch to provide the second supply voltage to the second latch, according to the third supply voltage, and
wherein one end of the second resistor is electrically coupled to the second latch to provide the second source voltage to the second latch, according to the third supply voltage.

17. The system of claim 16,
wherein the resistor ladder further includes a third resistor and a fourth resistor electrically coupled in series with the first resistor and the second resistor,
wherein one end of the third resistor is electrically coupled to the first latch to provide the first supply voltage to the first latch, according to the third supply voltage, and
wherein one end of the fourth resistor is electrically coupled to the first latch to provide the first source voltage to the first latch, according to the third supply voltage.

18. The system of claim 16,
wherein the third supply voltage is higher than the second supply voltage,
wherein the second supply voltage is higher than the first supply voltage,
wherein the second source voltage is higher than the first source voltage, and
wherein the first source voltage is higher than the third source voltage.

19. A method comprising:
generating, by circuitry, a first signal having a first voltage amplitude, according to a first supply voltage;
modifying, by a latch of the circuitry, the first signal to generate a second signal having a second voltage amplitude, according to a second supply voltage higher than the first supply voltage;
detecting, by a resistor ladder of the circuitry, a change in the second signal attributed by a capacitor coupled to an input of the latch; and
adjusting, by the resistor ladder of the circuitry, the second supply voltage, according to the detected change in the second signal.

20. The method of claim 19, wherein adjusting, by the resistor ladder, the second supply voltage, according to the detected change in the second signal includes:
adjusting, by the resistor ladder, the second supply voltage to reduce a difference between i) the change in the second signal attributed by the capacitor, and ii) the second voltage amplitude.

* * * * *